(12) United States Patent
Kasai

(10) Patent No.: US 6,653,690 B1
(45) Date of Patent: *Nov. 25, 2003

(54) SEMICONDUCTOR DEVICE COMPRISING HIGH DENSITY INTEGRATED CIRCUIT HAVING A LARGE NUMBER OF INSULATED GATE FIELD EFFECT TRANSISTORS

(75) Inventor: Naoki Kasai, Tokyo (JP)

(73) Assignee: NEC Electronics Corporation, Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 25 days.

(21) Appl. No.: 09/049,944

(22) Filed: Mar. 30, 1998

(30) Foreign Application Priority Data

Mar. 31, 1997 (JP) ............................... 9-080270

(51) Int. Cl.$^7$ ........................... H01L 29/76; H01L 23/48
(52) U.S. Cl. ........................ 257/377; 257/382; 257/384; 257/774
(58) Field of Search ................................ 257/368, 377, 257/306, 369, 382–385, 750–751, 754–757, 768–770, 773–775, 905–908

(56) References Cited

U.S. PATENT DOCUMENTS

| 4,890,148 | A |   | 12/1989 | Ikeda et al. ................... 357/45 |
|---|---|---|---|---|
| 5,122,857 | A | * | 6/1992 | Ikeda et al. ................. 257/903 |
| 5,146,300 | A | * | 9/1992 | Hamamoto et al. ......... 257/306 |
| 5,293,510 | A | * | 3/1994 | Takenaka ..................... 257/306 |
| 5,376,566 | A |   | 12/1994 | Gonzalez |
| 5,497,022 | A | * | 3/1996 | Sakamoto ................... 257/385 |
| 5,561,623 | A |   | 10/1996 | Ema |
| 5,963,813 | A | * | 10/1999 | Manning .................... 438/305 |

FOREIGN PATENT DOCUMENTS

| JP | 60-180169 | 9/1985 |
|---|---|---|
| JP | 61-97963 | 5/1986 |
| JP | 4-196440 | 7/1992 |
| JP | 05-003294 | 1/1993 |
| JP | 7-131003 | 5/1995 |

* cited by examiner

Primary Examiner—Ori Nadav
(74) Attorney, Agent, or Firm—Foley & Lardner

(57) ABSTRACT

It is a purpose of the invention to provide a semiconductor device comprising a high density integrated circuit having a large number of insulated gate field effect transistors having minute size and improved performance and uniformity. The source contact resistance is set in a value smaller than that of the drain contact resistance by making the diameter of a source contact of an insulated gate field effect transistor larger than that of the drain contact, so as to improve the current driving capability of the transistor and to reduce the variation in the capability.

9 Claims, 10 Drawing Sheets

SEMICONDUCTOR DEVICE COMPRISING HIGH DENSITY INTEGRATED CIRCUIT HAVING A LARGE NUMBER OF INSULATED GATE FIELD EFFECT TRANSISTORS

BACKGROUND OF THE INVENTION

1. Field of the Invention

The present invention relates to a semiconductor device comprising a high density integrated circuit having a large number of insulated gate field effect transistors, and more particularly relates to a semiconductor device aiming at high density integration of transistors while reducing effects of the contact resistance against the transistor performance.

2. Description of the Related Art

Because of improvement in integration density due to the minimization of semiconductor elements, the memory capacity of dynamic random access memory (DRAM) for example, has increased by four times in three years. It is needless to say that the area of a memory cell for storing information has been reduced by minimizing the size of an element. Improvement in the aforementioned integration has been achieved, by reducing also the size of an element used for a peripheral circuit for writing and reading information stored in a memory cell.

One of the important peripheral circuits of DRAM is a sense amplifier. FIG. 1 is a circuit diagram showing a typical sense amplifier, which is a shared sense amplifier of folded bit line structure. A sense amplifier includes a pair of bit lines BLa and BLb, which extend to memory cell array region 251a and 251b on the both sides of the sense amplifier. Respective bit lines BLa and BLb are connected with input/output lines I/Oa and I/Ob through a transistor which serves as a switch.

Also provided are transfer gate TG for selecting one of the cell array memory regions, PDL and HVCD connected with a bit line equalizer circuit, and amplifier circuit 254. Amplifier circuit 254, in which inputs and outputs of the two CMOS inverters consisting of N channel transistors 252a, 252b and P channel transistors 253a, 253b cross each other, is connected with bit lines BLa and BLb. A flip-flop consisting of the N channel transistor is connected with sense amplifier driving line SAN, while a flip-flop consisting of the P channel transistor is connected with sense amplifier driving line SAP.

The sense amplifier is required to have a function for detecting a small potential difference which is readout to one of the bit lines by the electric charge stored in the memory cell. The crucial point for obtaining a high performance sense amplifier is that the bit line capacity of pair of bit lines BLa and BLb, performance of elements connected with the bit lines and their resistance of wiring and contact are equal. Among others, it is important that the balance of performance of the pair of transistors constituting amplifier circuit 254 are equal to each other.

Therefore, it is desirable to make the shape and layout of component patterns constituting a pair of bit lines and elements to be connected with the bit lines equal. FIG. 2 shows the layout pattern of typical amplifier circuit 254. Since the sense amplifiers are arrayed in accordance with the memory cell array, patterns for the four amplifiers are shown to facilitate the explanation of the layout pattern. The amplifier circuit shown in FIG. 2 has a structure of shared sense amplifier. The pattern width of amplifier circuit 254 is twice the pattern width of the memory cell, that is, the pitch of the bit line of amplifier circuit 254 is twice the pitch of the bit line of the memory cell.

Hereinafter, the structure of the amplifier circuit will be described in detail. As for the size of each pattern, the size of first generation 256 DRAM of minimum design dimensions 0.25 μm is given as an example. In general, the design dimensions of a peripheral circuit region is set in values larger than those of the minimum design dimensions used in the memory cell array region. The pitch of the bit line of the memory cell is 0.6 μm. The pitch of the bit line of the sense amplifier region is 1.2 μm, and the width of one amplifier circuit is 2.4 μm.

As shown in FIG. 3, a P well 204 is formed in N channel transistor region 201 on the surface of P-type silicon substrate 203, and N well 205 is formed in P channel transistor region 202. Two regions 204 and 205 are separated by field oxide film 206 formed with the ordinary selective oxidation method.

In the region where a transistor is formed except for the region of field oxide film 206, gate oxide film 207 is formed. In the desired region on the surface of gate oxide film 207 and field oxide film 206, formed are N gate electrode 208 and P gate electrode 209 which serve as gate electrodes of the N channel transistor and the P channel transistor, each having width 0.7 μm and consisting of an N-type polycrystalline silicon layer.

On the surface of P well 204 except for the region in which field oxide film 206 and N gate electrode 208 are formed, N-type diffusion layer 210 which serves as a source drain of the N channel transistor is formed. On the surface of N well 205 except for the region in which field oxide film 206 and P gate electrode 209 are formed, P-type diffusion layer 211 which serves as a source drain of the P channel transistor is formed.

In the desired region in inter-layer insulation film 219, formed are N drain contact 212 having diameter of 0.4 μm and connecting N-type diffusion layer 210 which serves as a drain of the N channel transistor and bit line 216, N gate contact 214 having diameter of 0.4 μm and connecting N gate electrode 208 and bit line 216, P drain contact 213 having diameter of 0.4 μm and connecting P-type diffusion layer 211 which serves as a drain of the P channel transistor and bit line 216, and P gate contact 215 having diameter of 0.4 μm and connecting P gate electrode 209 and bit line 216.

In the above, each of N drain contact 212, N gate contact 214, P drain contact 213 and P gate contact 215 are formed of a contact plug embedded with barrier metal consisting of TiN/Ti and tungsten. In a desired region of inter-layer insulation film 219, formed are N source contact 212 having diameter of 0.4 μm which is used in common in the two N channel transistors and connecting N-type diffusion layer 210 which serves as a common source of the two N channel transistors and SAN wiring 220, and a P source contact having diameter of 0.4 μm which is used in common in the two P channel transistors and connecting P-type diffusion layer 211 which serves as a common source of the two P channel transistors and SAP wiring 221. Each of N source contact 217 and P source contact 218 are formed of a contact plug embedded with barrier metal consisting of TiN/Ti and tungsten.

Integration of a semiconductor device has been carried out by reducing the size of elements in accordance with the scaling rule. In order to explain the effects of parasitic resistance which cause troubles when elements are reduced in size, the components constituting a transistor and resistors in the current path of the transistor are shown in FIG. 4. According to the scaling rule, in a constant electric field where the voltage drops in proportion to a decrease in the element size, channel resistance Rch of the transistor is kept constant. On the other hand, resistance of a parasitic component such as a contact or wiring increases when the size is decreased. For example, wiring resistance (Rws, Rwd), plug resistance (Rps, Rpd) connecting the wiring and the diffusion layer and diffusion layer resistance (Rds, Rdd) increase inversely with the scaling down. Contact resistance (Rcs, Rcd) between the plug and the diffusion layer, which increases inversely with the contact area, increases in inverse square of the diameter of the contact.

When an element has larger dimensions (e.g., larger than 1 $\mu$m), since the aforementioned parasitic resistance has a sufficiently small value compared with that of the channel resistance, it has little influence over the current driving capability of the transistor. When the element is minimized to 0.5 $\mu$m or smaller, however, the parasitic resistance, the contact resistance against the channel resistance in particular, increases to a value too large to be neglected.

FIG. 5 shows, as an example, the relationship between the contact diameter and the contact resistor embedded with TiN/Ti barrier metal and tungsten connecting the N-type diffusion layer and an aluminum electrode. When the contact diameter reaches 0.4 $\mu$m, the contact resistance increases to scores of $\Omega$, and besides, the standard deviation indicating the extent of variation increases. The increase in the contact resistance due to the reduction in contact diameter and the variation cause a decrease in the drain current and an increase in its standard deviation as seen in FIG. 6, namely, affect the current driving capability of the transistor. Besides, the amount of decrease in the current driving capability is larger than the value expected with the increase in the contact resistance.

When current Id runs through the N channel transistor, for example, due to an I•R drop caused by the parasitic resistance (mainly the contact resistance Rcs or Rcd), the voltage at the source and the drain of the transistor changes due to the voltage supplied from the outside. In the case of the N channel transistor, wherein the voltage supplied to an external source terminal, a drain terminal, a gate terminal and a substrate terminal are given as Vs, Vd, Vg and Vb respectively (Vd>Vs), the source potential and the drain potential within the N transistor is given as $$Vs+Id\bullet Rcs \text{ and } Vd-Id\bullet Rcd.$$

SUMMARY OF THE INVENTION

In general, electric current does not run through a gate terminal and a substrate terminal, within the operation range of a transistor in a normal stationary state. Therefore, Vg and Vb are the same values within the transistor. However, since the gate potential and the substrate potential which have significance in the transistor characteristic are potential with respect to the source potential serving as a standard potential, actual gate potential and substrate potential are expressed in equations:

$$Vgs=Vg-(Vs+Id\bullet Rcs);$$

and $$Vbs=Vb-(Vs+Id\bullet Rcs).$$

This means that the gate potential and the substrate potential decrease. Therefore, the drain current running through the transistor may decrease due to a change in the standard source potential, as well as in the parasitic contact resistance.

Namely, the first problem to be solved is that in the case of current driving capability of a transistor of 0.5 $\mu$m or smaller in size, the parasitic source contact resistance on the source side and an increase in variation thereof may cause a drop in the current driving capability of the transistor and an increase in variation of the transistor characteristic.

The second problem to be solved is that the unbalance in the transistor characteristic due to the variation in the contact resistance may deteriorate the performance of a flip-flop circuit, and decrease the reliability in the integrated circuit.

It is an object of the present invention to provide a semiconductor device comprising a high density integrated circuit having a large number of insulated gate field effect transistors with improved performance of the transistors of minimum size and with improved uniformity in performance thereof.

In order to achieve the object above, a semiconductor device according to the present invention is a semiconductor device comprising a high density integrated circuit having a large number of insulated gate field effect transistors wherein the source contact resistance is smaller than the drain contact resistance.

The above insulated gate field effect transistors are used to form pairs of transistors in a flip-flop circuit.

Each of the above insulated gate field effect transistors has a diameter larger than that of the drain contact.

Each of the above insulated gate field effect transistors has a silicide layer formed only on its diffusion layer which is to serves as a source thereof, while silicide layer is not formed on the diffusion layer which is to serve as a drain.

In the above insulated gate field effect transistor, the material connecting the source contact plug and the diffusion layer is different from the material used for connecting the drain contact plug and the diffusion layer.

According to the semiconductor device of the present invention, the source contact resistance of the transistor is lower than the drain contact resistance thereof. Therefore, increase in the transistor current driving capability and uniformity in the transistor characteristic can be accomplished while high density integration is also achieved. As a result, the operation of the integrated circuit using a flip-flop amplifier circuit is stabilized.

The above and the other object, features, and advantages of the present invention will become apparent from the following description based on the accompanying drawings which illustrate an example of a preferred embodiment of the present invention.

DETAILED DESCRIPTION OF THE PREFERRED EMBODIMENTS

Preferred embodiments of the present invention will be described below in reference to the drawings.

(Embodiment 1)

Figure 7:
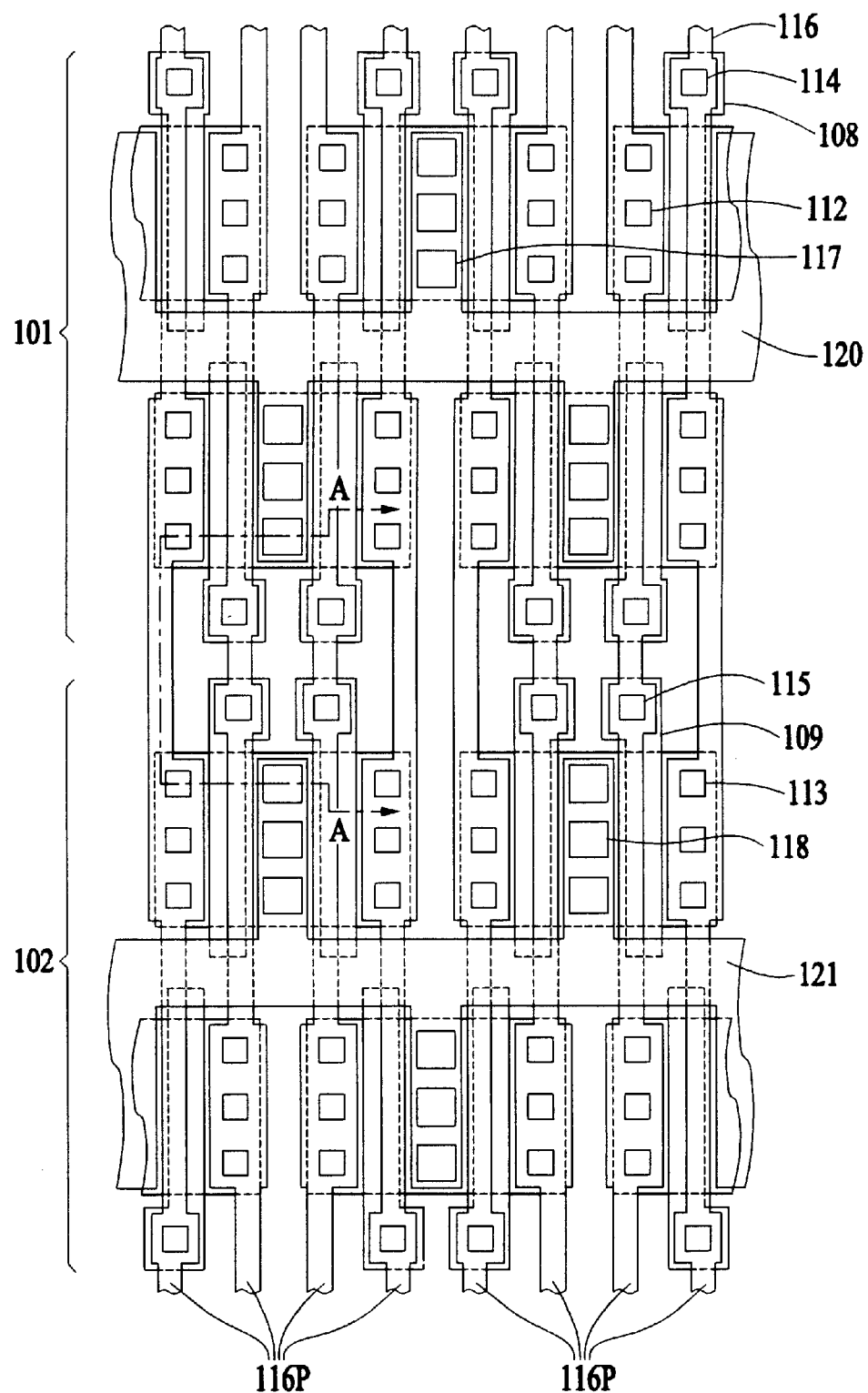
FIG. 7 is a plan view showing the constitution of the amplifier circuit of embodiment 1 of the semiconductor device of the present invention.
Figure 8:
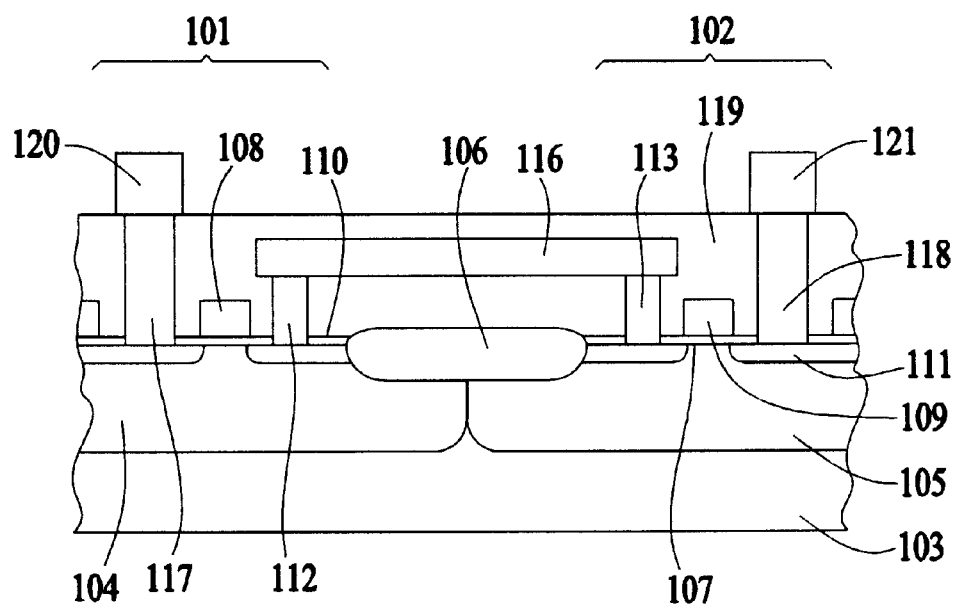
FIG. 8 is a sectional view taken along line A—A in FIG. 7.

FIG. 7 is a plan view showing an amplifier circuit which constitutes a semiconductor device according to embodiment 1 of the present invention. FIG. 8 is a sectional view taken along line A—A in FIG. 7. Here, embodiment 1 of the present invention is applied in 256 M bit DRAM of 0.25 $\mu$m based on the design rule.

In reference to FIG. 7 and FIG. 8, the pitch of bit line 116 in a memory cell is 0.6 $\mu$m. The pitch of a bit line 116 in a sense amplifier region is 1.2 $\mu$m. On the surface of P-type silicon substrate 103 in N channel transistor region 101, P well 104 is formed, and in P channel transistor region 102, N well 105 is formed. Two regions 104 and 105 are separated by a field oxide film formed with the ordinary selective oxidation method.

Gate oxide film 107 is formed in the region constituting a transistor except for the region of field oxide film 106. On the desired region on the surface of gate oxide film 107 and field oxide film 106, formed are N gate electrode 108 and P gate electrode 109 each having width of 0.7 $\mu$m and being formed of N-type polycrystalline silicon layers to serve as gate electrodes of the N channel transistor and the P channel transistor.

On the surface of P well 104 except for the region where field oxide film 106 and N gate electrode 108 are formed, N-type diffusion layer 110 is formed, and on the surface of the N well 105 except for the region where field oxide film 106 and P gate electrode 109 are formed, P-type diffusion layer 111 is formed.

In a desired region of inter-layer insulation film 119, formed are N drain contact 112 having a diameter of 0.4 $\mu$m and connecting N-type diffusion layer 110 which serves as a drain of the N channel transistor and bit line 116, N gate contact 114 having diameter of 0.4 $\mu$m and connecting N gate electrode 108 and bit line 116, P drain contact 113 having diameter of 0.4 $\mu$m and connecting P-type diffusion layer 111 and bit line 116, and P gate contact 115 having diameter of 0.4 $\mu$m and connecting the P gate electrode and bit line 116. Here, N drain contact 112, N gate contact 114, P drain contact 113 and P gate contact 115 are formed of a contact plug embedded with barrier metal consisting of TiN/Ti and tungsten.

In a desired region of inter-layer insulation film 119, formed are N source contact 117 having diameter of 0.6 $\mu$m which is used in common in the two N channel transistors connecting N-type diffusion layer 110 which serves as a common source of the two N channel transistors and SAN wiring 120, and P source contact 118 having diameter of 0.6 $\mu$m which is used in common in the two P channel transistors connecting P-type diffusion layer 111 which serves as a common source of the two P channel transistors and SAP wiring 121. Each of N source contact 117 and P source contact 118 are formed of a contact plug embedded with barrier metal consists of TiN/Ti and tungsten.

Figure 5:
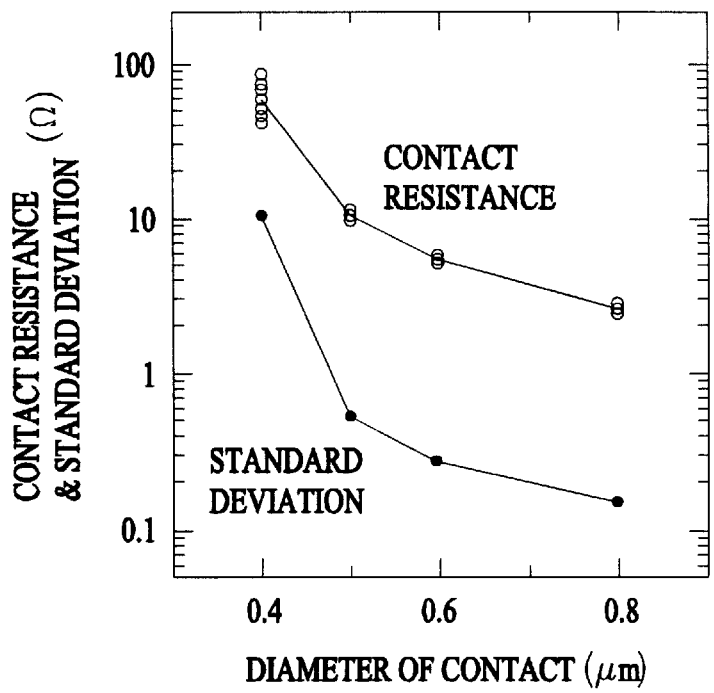
FIG. 5 is a diagram showing changes in contact resistance with respect to the contact diameter and the standard deviation thereof (applicable to the present invention).
Figure 6:
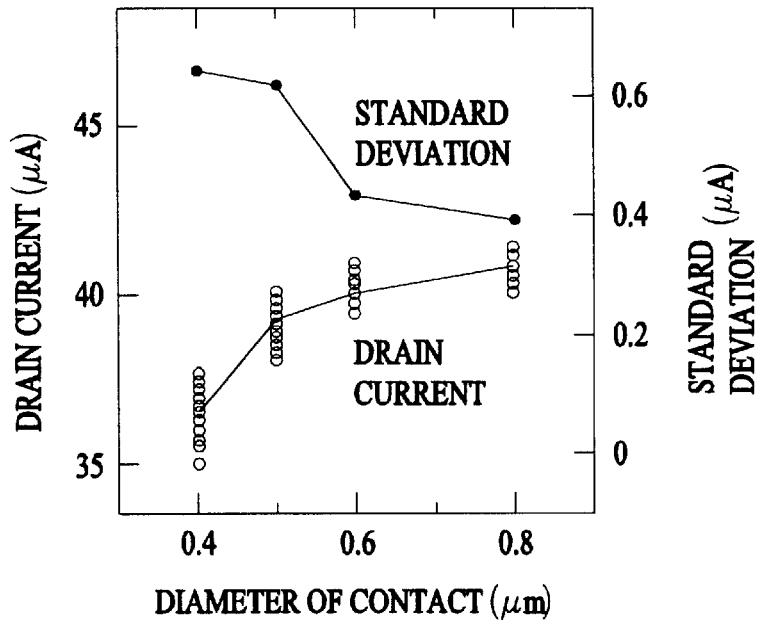
FIG. 6 is a diagram showing changes in drain current of a transistor with respect to the contact diameter and the standard deviation thereof (applicable to the present invention).

In embodiment 1 of the present invention, the distinction from the prior art is that the contact diameters of N source contact 117 and P source contact 118 are increased by 0.2 $\mu$m, from 0.4 $\mu$m to 0.6 $\mu$m. That is, the N source contact resistance has decreased from about 60 $\Omega$ to about 6 $\Omega$ as shown in FIG. 5, and the P source contact has also decreased to a great deal.

In order to increase the contact diameter of N source contact 117 and P source contact 118 by 0.2 $\mu$m, it is required to increase the width of N-type diffusion layer 110 connected with N source contact 117 by 0.2 $\mu$m. Since N-type diffusion layer 110 connected with N source contact 117 is used in common in the two N channel transistors, the region forming an element of an amplifier circuit increases by 0.2 $\mu$m, and the width of field oxide film 106 for separating the elements is decreased by 0.2 $\mu$m, unless the pattern width forming an amplifier circuit pattern is not changed. In P channel transistor region 102, similarly, the width of field oxide film 106 for separating the elements is decreased by 0.2 $\mu$m.

Figure 1:
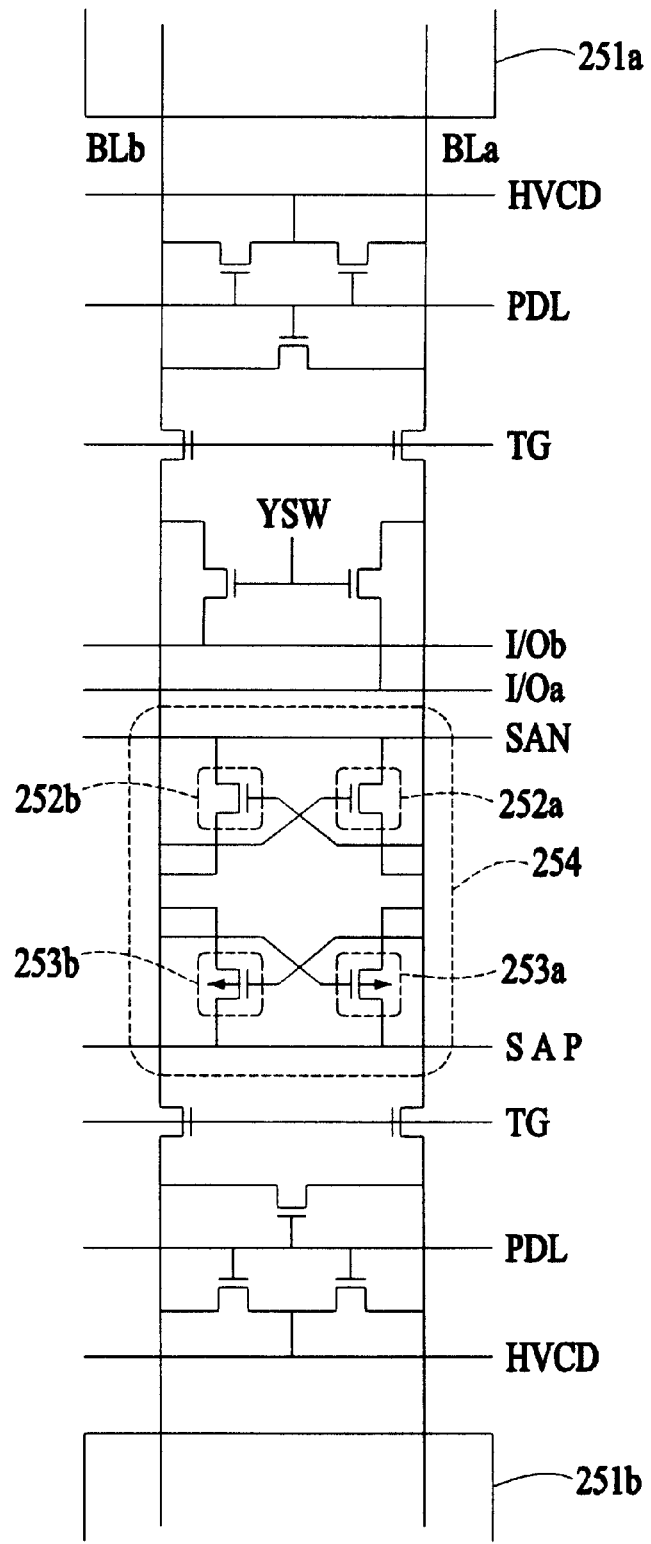
FIG. 1 is a circuit diagram of a sense amplifier of DRAM shown as an example of application of prior art semiconductor device (applicable to the present invention).
Figure 2:
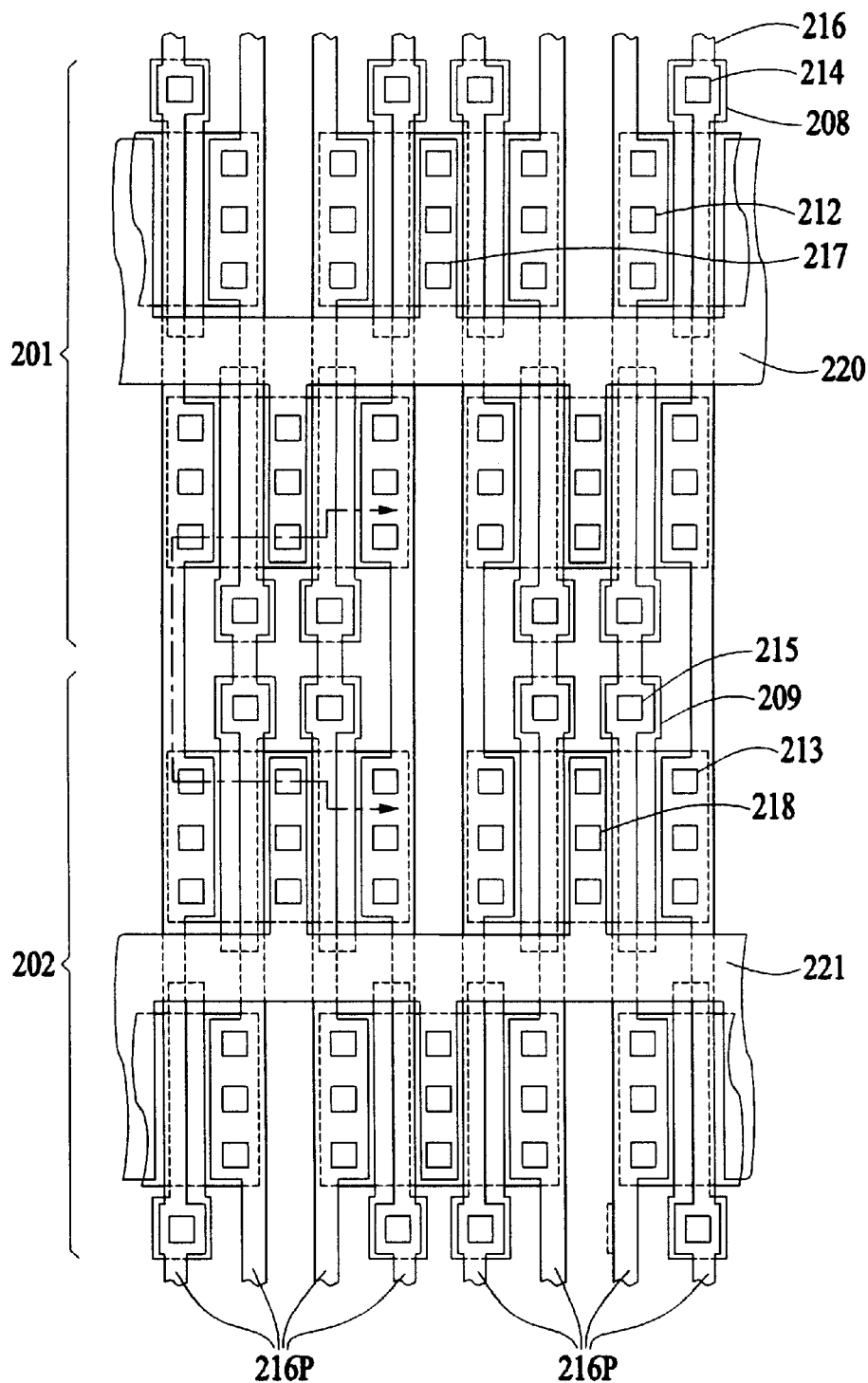
FIG. 2 is a plan view showing the constitution of amplifier circuit of an prior art semiconductor device.
Figure 3:
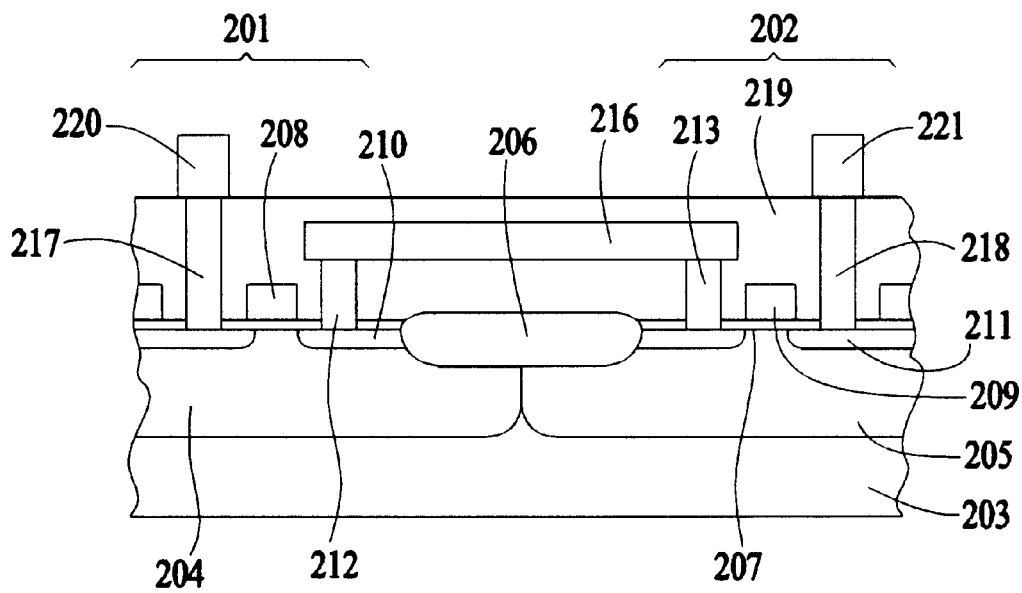
FIG. 3 is a sectional view showing the constitution of the transistor region of the prior art semiconductor device.
Figure 4:
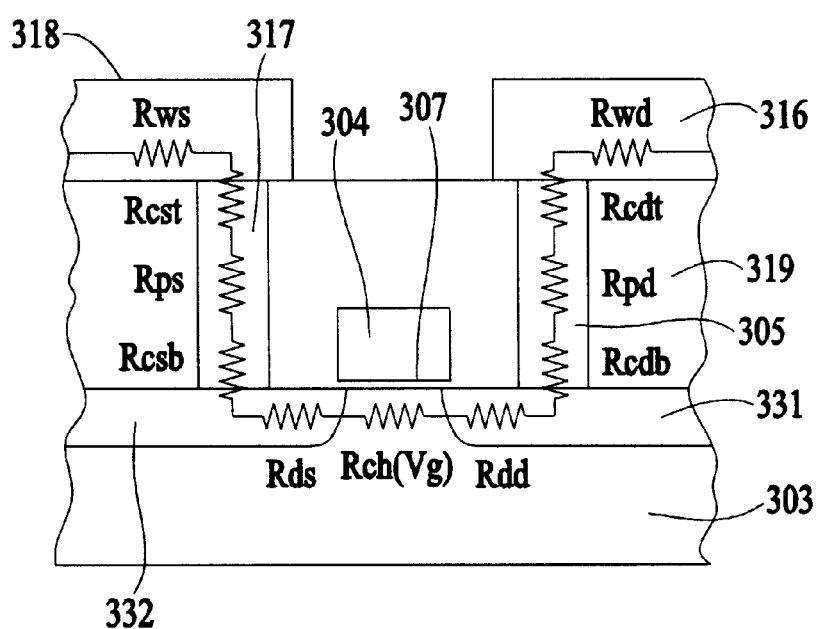
FIG. 4 is diagram showing components constituting a coventional transistor and resistors existing in the current path of the transistor (applicable to the present invention).

In the prior art example shown in FIG. 2, the width of field oxide film 106 for separating the elements is 1.0 $\mu$m. In embodiment 1, on the other hand, it has decreased to 0.8 $\mu$m. Since a film having width of 0.8 $\mu$m for separating the elements can be produced without changing the production process, it is easily realized only by changing a mask pattern.

In order to increase the contact diameter of N drain contact 112 and P drain contact 113 from 0.4 $\mu$m to 0.6 $\mu$m to decrease the contact resistance on the drain side as well, the width of field oxide film 106 for separating the elements must be decreased to 0.4 $\mu$m. It is difficult to achieve the above goal in P channel transistor region 102 with the element separating method using field oxide film 106 having element separation width of 0.4 $\mu$m which is formed with the ordinary selective oxidation method. Therefore, a great change is needed in the production process such as introduction of a new element separation method, and a change only in the mask pattern does not work.

(Embodiment 2)

Next, embodiment 2 will be described in reference to the drawings.

Figure 9:
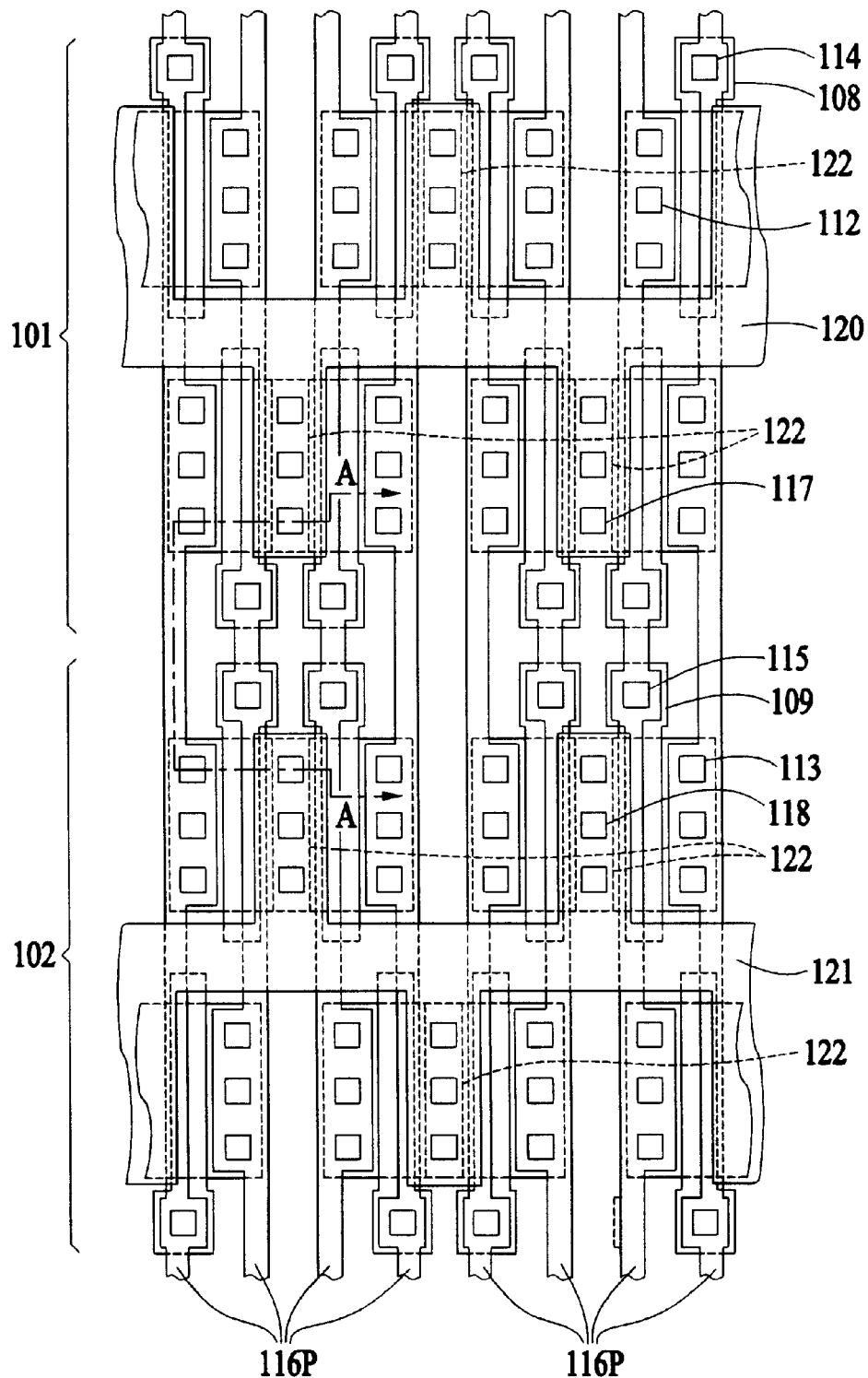
FIG. 9 is a plan view showing embodiment 2 of the present invention.
Figure 10:
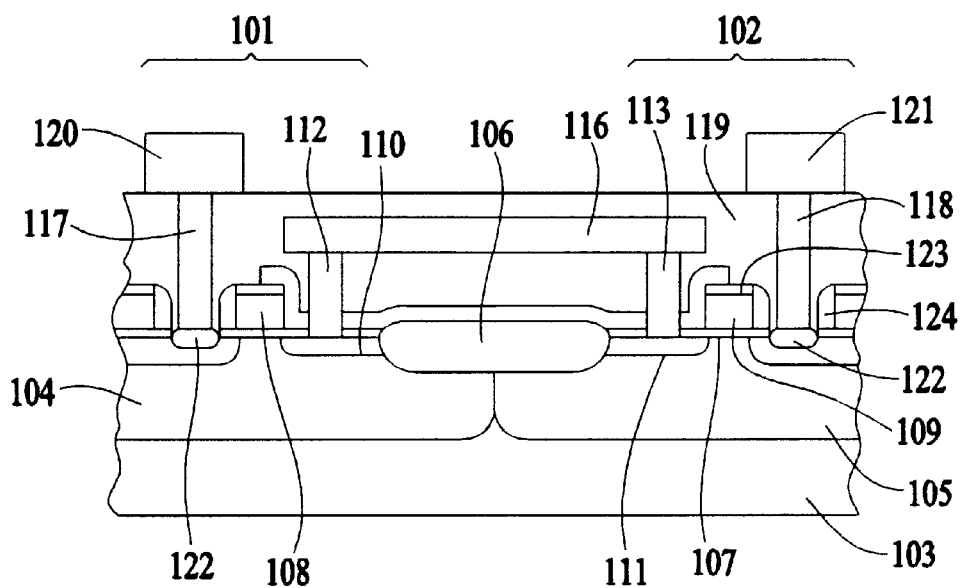
FIG. 10 is a sectional view taken along line A—A in FIG. 9.

FIG. 9 is a plan view showing an amplifier circuit constituting a semiconductor device according to embodiment 2 of the present invention. FIG. 10 is a sectional view taken along line A—A in FIG. 9. Embodiment 2 of the present invention can also be applied to 256 M-bit DRAM based on 0.25 $\mu$m design rule.

In reference to FIG. 9 and FIG. 10, the pitch of bit line 116 of the memory cell is 0.6 $\mu$m. The pitch of bit line 116 in the sense amplifier region is 1.2 $\mu$m. On the surface of P-type silicon substrate 103 in N channel transistor region 101, P well 104 is formed, and in P channel transistor region 102, N well 105 is formed. Two regions 104 and 105 are separated by field oxide film 106 formed with the ordinary selective oxidation method.

In the region constituting a transistor except for the region of field oxide film 106, gate oxide film 107 is formed. In the desired region on the surface of gate oxide film 107 and field oxide film 106, formed are N gate electrode 108 and P gate electrode 109 each having width of 0.7 $\mu$m and being formed of N-type polycrystalline silicon layer, which respectively serve as gate electrodes of the N channel transistor and the P channel transistor.

On the upper portion of N gate electrode 108 and P gate electrode 109, first supplementary insulation film 123 consisting of a silicon oxide film is formed. On the surface of P well 104 except for the region where field oxide film 106 and N gate electrode 108 are formed, N-type diffusion layer 110 is formed, and on the surface of N well 105 except for the region where field oxide film 106 and P-gate electrode 109 are formed, P-type diffusion layer 111 is formed.

At least N-type diffusion layer 110 on which N drain contact 112, P-type diffusion layer 111 on which P drain contact 113 is formed, and a second supplementary insulation film 124 consisting of a silicon oxide film covering the side faces of N gate electrode 108 and P gate electrode 109, are formed. Silicide layer 122 made of TiSi2 is formed, in the region determined by field oxide film 106 on the surface of N-type diffusion layer 110 on which the N source contact is formed and on the surface of P-type diffusion layer 111 on which the P source contact is formed, and the second supplementary insulation film formed on the side face of N gate electrode 108 and the side face of P gate electrode 109.

In the desired region of inter-layer insulation film 119, first supplementary insulation film 123 and second supplementary insulation film 124, formed are N drain contact 112 having diameter 0.4 μm and connecting N-type diffusion layer 110 which serves as a drain of the N channel transistor and bit line 116, N gate contact 114 having diameter of 0.4 μm and connecting N gate electrode 108 and bit line 116, P drain contact 113 having diameter of 0.4 μm and connecting P-type diffusion layer 111 which serves as a drain of the P channel transistor and bit line 116, and P gate contact 115 having diameter of 0.4 μm and connecting P-gate electrode 109 and bit line 116. In the above, N drain contact 112, N gate contact 114, P drain contact 113 and P gate contact 115 consist of a contact plug embedded with barrier metal consisting of TiN/Ti and tungsten.

In a desired region of inter-layer insulation film 119, formed are N source contact 117 having diameter of 0.4 μm which is used in common in the two N channel transistors connecting silicide layer 122 formed on the surface of N-type diffusion layer 110 which serves as a common source of the two N channel transistors and SAN wiring 120, and P source contact 118 having diameter of 0.4 μm which is used in common in the two P channel transistors connecting silicide layer 122 formed on the surface of P-type diffusion layer 111 which serves as a common source of the two P channel transistors and SAP wiring 121. Each of N source contact 117 and P source contact 118 consists of a contact plug embedded with barrier metal consists of TiN/Ti and tungsten.

As for embodiment 2 of the present invention, the distinction from the prior art is that silicide layer 122 is formed only in the region where source contact is formed. Silicide layer 122 is aimed to decrease contact resistance between the diffusion layer and the contact plug. Since silicide layer 122 is formed on the entire surface of the diffusion layer even when the contact diameter is as small as 0.4 μm, the contact area is virtually increased, and the contact resistance is decreased.

It is possible to form a silicide layer on the diffusion layer forming the drain contact. In this case, in order to prevent an increase in junction leak current between the diffusion layer and the well, it is required to make the region of the diffusion layer in which a silicide layer is formed deeper than in the case where the silicide layer is not formed.

Since a high voltage is applied to the drain, when the drain junction is made deeper, a remarkable drop is observed in a threshold voltage due to the short channel effect of the transistor.

In order to curb the drop, the width of the gate electrode must be increased, which causes another problem of deterioration in the current driving capability of the transistor.

Although forming of silicide layer 122 according to the present invention requires more production processes compared with the prior art, it does not require an increase in the diameter of the source contact. Therefore, it is an advantageous method for minimizing the elements to be used in higher-density integration.

(Embodiment 3)

Next, embodiment 3 of the present invention will be described in reference to the drawings.

Figure 11:
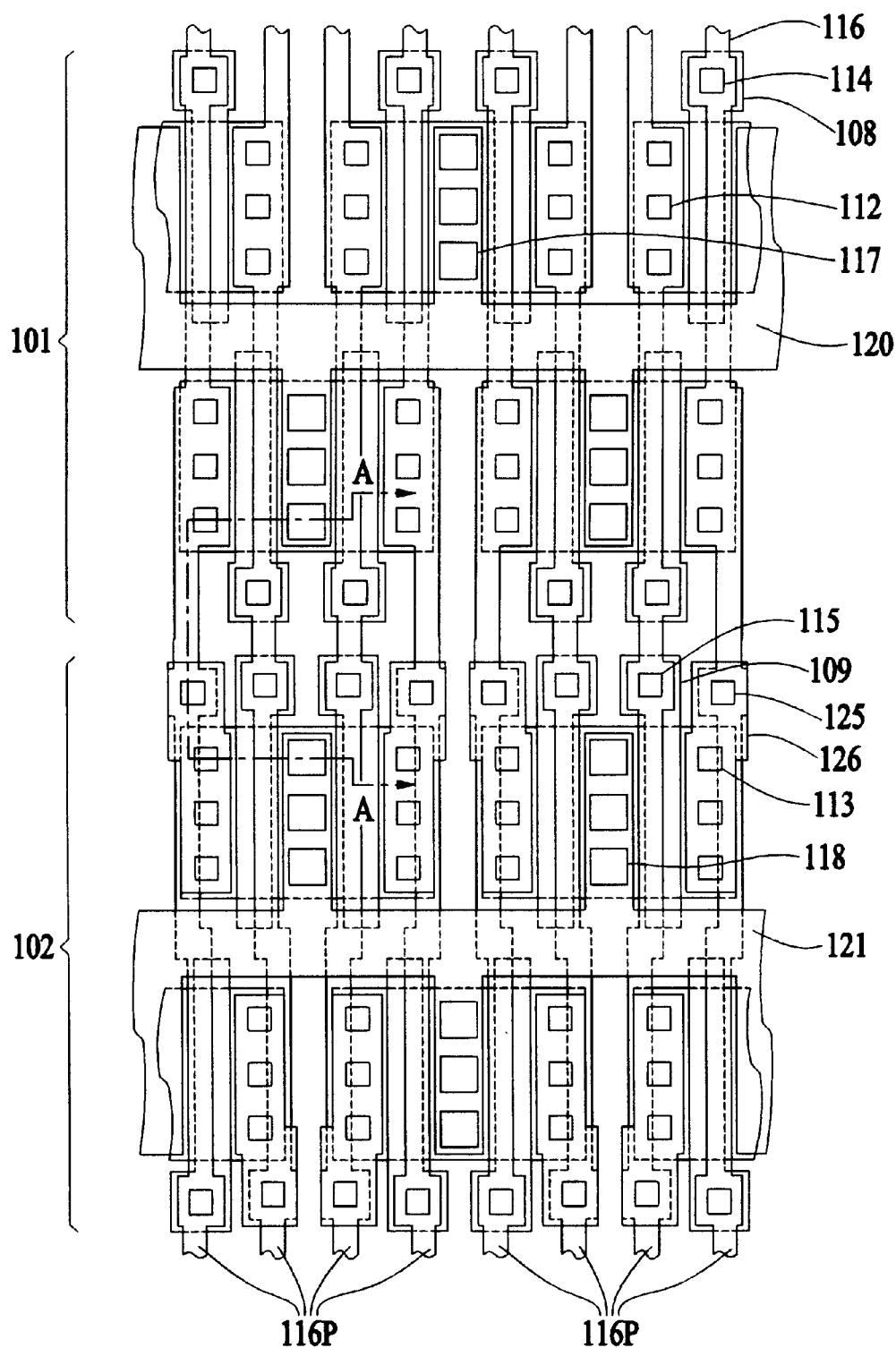
FIG. 11 is a plan view showing embodiment 3 of the present invention.
Figure 12:
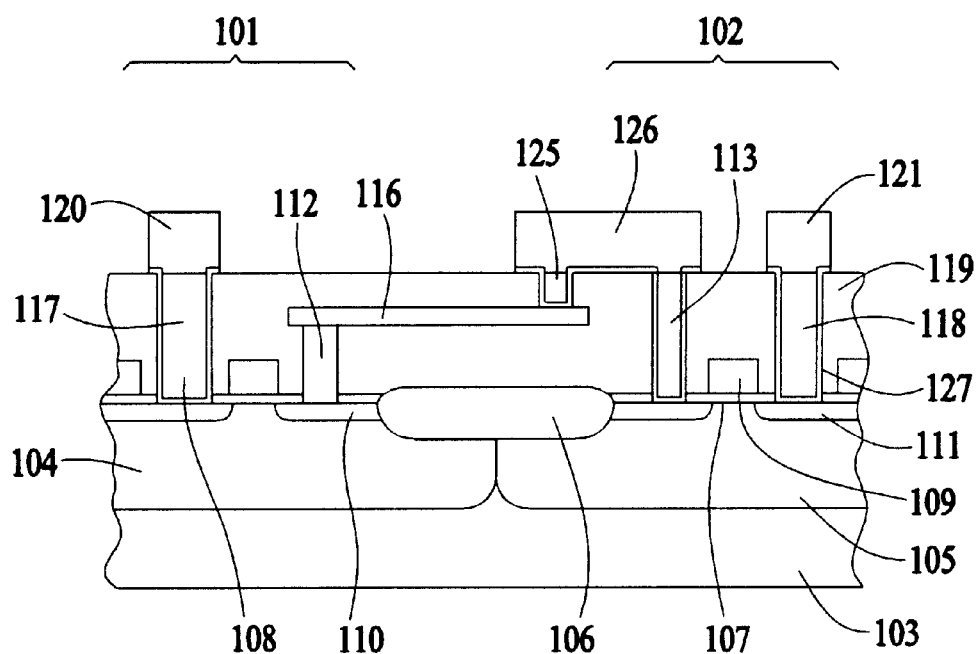
FIG. 12 is a sectional view taken along line A—A in FIG. 11.

FIG. 11 is a plan view showing an amplifier circuit which constitutes a semiconductor according to embodiment 3 of the invention. FIG. 12 is a sectional view taken along a line A—A in FIG. 11. Here, embodiment 3 is applied to 256 m bit DRAM based on 0.25 μm design rule, in which a capacitor of a memory cell is formed on the upper portion of the bit line.

In reference to FIG. 11 and FIG. 12, the pitch of bit line 116 in a memory cell is 0.6 μm. The pitch of bit line 116 in a sense amplifier region is 1.2 μm. On the surface of P-type silicon substrate 103 in N channel transistor region 101, P well 104 is formed, and in P channel transistor region 102, N well 105 is formed. Two regions 104 and 105 are separated by field oxide film 106 formed with the ordinary selective oxidation method.

Gate oxide film 107 is formed in the region where a transistor is to be formed except for the region of filed oxide film 106, and on the desired region on the surface of gate oxide film 107 and field oxide film 106, formed are N gate electrode 108 and P gate electrode 109 having width of 0.7 μm and formed of N-type polycrystalline silicon layers which serve as gate electrodes of the N channel transistor and the P channel transistor.

On the surface of P well 104 except for the region where field oxide film 106 and N gate electrode 108 are formed, N-type diffusion layer 110 is formed. On the surface of the N well except for the region where field oxide film 106 and P gate electrode 109 are formed, P-type diffusion layer 211 is formed. In a desired region of inter-layer insulation film 119, formed are N drain contact 112 having diameter of 0.4 μm and connecting N-type diffusion layer 110 which serves as a drain of the N channel transistor and bit line 116, N gate contact 114 having diameter of 0.4 μm and connecting N gate electrode 108 and bit line 116, and P gate contact 115 having diameter of 0.4 μm and connecting P gate electrode 109 and bit line 116. Here, N drain contact 112, N gate contact 114, and P gate contact 115 consist of a contact plug embedding N-type polycrystalline silicon. Bit line 116 consist of a tungsten silicide layer.

In a desired region of inter-layer insulation film 119, formed are P drain contact 113 having diameter of 0.4 μm and connecting P-type diffusion layer 111 which serves as drain and contact wiring 126, wiring connection contact 125 having diameter of 0.4 μm and connecting the bit line 116 and connection wiring 126, N source contact 117 having diameter of 0.6 μm, which is used in common in the two N channel transistors connecting N-type diffusion layer 110 which serves as a common source of the two N channel transistors and SAN wiring 120, and P source contact 118 having diameter of 0.6 μm, which is used in common in the two P channel transistors connecting P-type diffusion layer 111 which serves as a common source of the two P channel transistors and SAP wiring 121. Here, P drain contact 113, wiring connection contact 125, N source contact 117 and P source contact 118 are embedded with barrier metal layer 127 consisting of TiN/Ti and a tungsten plug.

In embodiment 3 of the present invention, the distinction from embodiment 1 is that poly silicon plug is used which is embedding N-type polysilicon in the N drain contact which connects bit line 116 consisting of a tungsten silicide layer and N-type diffusion layer 110.

Since the N-type polysilicon and the N diffusion layer are basically made of the same material, the contact resistance between the bit line made of tungsten silicide and the N-type polysilicon and the resistance of the polysilicon plug itself is high, while the contact resistance is low. Therefore, the embodiment has an indirect advantage that the storage capacity increases due to the memory cell structure in which a capacitor is formed on the bit line by virtue of using a heat-resistant bit line, although it has a demerit that the N drain contact resistance is higher than the N source contact resistance. Although the drain contact resistance increases, the source contact resistance does not increase, by introducing the construction of the memory cell above.

In the embodiments, an amplifier circuit of the DRAM sense amplifier has been described. The embodiment is not limited to those described above, and any transistor can be employed such as a transistor with a SRAM memory cell or a flip-flop of a logical device.

As described above, according to a semiconductor device of the present invention, since source contact resistance can be decreased without impeding integration, improvement in transistor current driving capability and uniformity in transistor characteristic can be achieved. The reason is that a change in source potential within the transistor due to R•I drop caused by parasitic source contact resistance is small, when electric current runs between a source terminal of the transistor and a drain terminal thereof.

Further, since increase in transistor current driving capability and uniformity in transistor characteristic are thus achieved, the performance of the amplifier circuit of the flip-flop is enhanced, and stability and reliability in the integrated circuit is improved. The reason is that the difference in characteristic between a pair of transistors constituting the flip-flop is reduced due to reduction in the source contact resistance.

Besides, according to embodiment 1 of the present invention, the source contact diameter is increased without any change or addition in the production process of the semiconductor device, and without a change in the size of the drain contact. Therefore the source contact resistance can be reduced without impeding a large scale high-density integration. The reason is that the component patterns can be arranged by increasing the size of the source contact, without deviating the limitation of other components such as element separation and without increasing the pattern area of the integrated circuit.

Further, according to embodiment 2, the source contact resistance can be reduced without making any change such as an increase in the size of the component patterns. The reason is that by forming a silicide layer only in the region of the diffusion layer where the source contact is formed, the substantial contact area can be increased without increasing the source contact diameter, and also the short channel effect of the transistor can be curbed, thereby eliminating the necessity for increasing the gate length.

According to embodiment 3 of the present invention, the source contact resistance does not increase in DRAM in which a capacitor is formed on the bit line. The reason is that a heat-resistant material, which is used for the bit line and the contact plug, is used for the drain contact, but is not used for the source contact.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device, comprising:
   a sense amplifier including first and second NMOS transistors and first and second PMOS transistors, each transistor having a size of about 0.5 μm or smaller, and further including first and second signal lines and first and second connector lines;
   wherein each of said transistors includes a source contact plug, a source diffusion layer, a drain contact plug, and a drain diffusion layer;
   wherein said first signal line and said first connector line are coupled via a first contact plug and said second signal line and said second connector line are coupled via a second contact plug;
   wherein said first signal line is coupled to said drain contact plug of said first NMOS transistor, and said first connector line is coupled to said drain contact plug of said first PMOS transistor;
   wherein said second signal line is coupled to said drain contact plug of said second NMOS transistor, and said second connector line is coupled to said drain contact plug of said second PMOS transistor;
   wherein for said first and second NMOS transistors, the source absolute voltage is fixed lower than the drain absolute voltage and for said first and second PMOS transistors, said source absolute voltage is fixed higher than said drain absolute voltage;
   wherein a source contact resistance, which is a resistance between the source contact plug and the source diffusion layer, of each of said transistors is smaller than a drain contact resistance, which is a resistance between the drain contact plug and the drain diffusion layer, of each of said transistors;
   wherein for each of said NMOS transistors, said source contact plug is made of tungsten and said drain contact plug is made of polysilicon;
   wherein for each of said PMOS transistors, said source contact plug and said drain contact plug are made of tungsten; and
   wherein said first and second signal lines are made of tungsten silicide, and said first and second connector lines and said first and second contact plugs are made of tungsten.

2. The semiconductor device according to claim 1, wherein the diameter of a source contact of each of said transistors is larger than the diameter of a drain contact of each of said transistors.

3. The semiconductor device of claim 2, wherein the diameter of the source contact is selected such that the source contact resistance is less than 10 ohms.

4. The semiconductor device according to claim 1, wherein a silicide layer is formed only on a diffusion layer which serves as a source, in each of said transistors.

5. The semiconductor device according to claim 4, wherein:
   the diameter of the source contact and the diameter of the drain contact in each of said transistors are approximately 0.6 micrometers and 0.4 micrometers, respectively; and
   the silicide layer, which is formed only on the diffusion layer which serves as the source in each of said transistors, is formed such that it lowers the source contact resistance.

6. The semiconductor device of claim 1, wherein the semiconductor device forms a 256 Mbit DRAM.

7. A semiconductor device having a plurality of transistors comprising:

insulated gate field effect transistors having a source contact resistance smaller than a drain contact resistance for each of said transistors, and a connector line and a signal line coupled via a first contact plug, said connector line and said contact plug made from tungsten, and said signal line made from tungsten silicide;

wherein source contact plugs of said transistors are made from layers of tungsten;

wherein said transistors comprise NMOS transistors and PMOS transistors and for said NMOS transistors, a source absolute voltage is fixed lower than a drain absolute voltage and for said PMOS transistors, said source absolute voltage is fixed higher than said drain absolute voltage;

wherein a drain contact plug of said NMOS transistors is made from polysilicon, and a drain contact plug of said PMOS transistors is made from tungsten;

wherein the drain contact plug of a first of said NMOS transistors is coupled to said signal line, and the drain contact plug of a first of said PMOS transistors is coupled to said connector line.

8. The semiconductor device according to claim 7, wherein barrier metals made from titanium or titanium nitride are provided around said source contact plugs, said drain contact plug of said first PMOS transistor, said first contact plug and said connector line.

9. The semiconductor device according to claim 8, wherein said transistors are used to form pairs of transistors in a flip-flop circuit.

\* \* \* \* \*